(12) United States Patent
Roy

(10) Patent No.: US 7,359,455 B1
(45) Date of Patent: Apr. 15, 2008

(54) DIGITAL MODULATION AND SHIFT KEYING

(75) Inventor: Yves Roy, Beauport (CA)

(73) Assignee: Domosys Corporation, Quebec (CA)

( * ) Notice: Subject to any disclaimer, the term of this patent is extended or adjusted under 35 U.S.C. 154(b) by 684 days.

(21) Appl. No.: 10/729,220

(22) Filed: Dec. 3, 2003

Related U.S. Application Data

(60) Provisional application No. 60/430,459, filed on Dec. 3, 2002.

(51) Int. Cl.
*H03C 3/00* (2006.01)
(52) U.S. Cl. .................................. 375/302; 375/289
(58) Field of Classification Search ............. 375/302, 375/308, 324, 322, 331, 332, 289
See application file for complete search history.

(56) References Cited

U.S. PATENT DOCUMENTS

| 5,488,352 | A | 1/1996 | Jasper | 340/431 |
| 5,566,088 | A | 10/1996 | Herscher et al. | 364/514 |
| 5,640,698 | A | 6/1997 | Shen et al. | 455/323 |
| 5,809,060 | A | 9/1998 | Cafarella et al. | 375/206 |
| 5,825,807 | A | 10/1998 | Kumar | 375/200 |
| 5,835,530 | A | 11/1998 | Hawkes | 375/225 |
| 5,937,000 | A | 8/1999 | Lee et al. | 375/200 |
| 5,943,361 | A | 8/1999 | Gilhousen et al. | 375/200 |
| 6,005,477 | A | 12/1999 | Deck et al. | 340/310.02 |
| 6,144,648 | A * | 11/2000 | Kurokami | 370/332 |
| 6,189,037 | B1 | 2/2001 | Adams et al. | 709/230 |
| 6,215,983 | B1 | 4/2001 | Dogan et al. | 455/63 |
| 6,307,877 | B1 | 10/2001 | Philips et al. | 375/130 |

* cited by examiner

*Primary Examiner*—Emmanuel Bayard
(74) *Attorney, Agent, or Firm*—Mathews, Sheperd, McKay & Bruneau, P.A.

(57) ABSTRACT

The present invention discloses an apparatus and a method of modulating a carrier with digital information having a series of datums represented in a plurality of symbols, the method comprising selecting a first number of half-periods of a first phase distinguished carrier signal for representing a corresponding symbol of a first one of the datums, selecting a second number of half-periods of a second phase distinguished carrier signal for representing a corresponding symbol of the datum following the first datum, determining at least one matching carrier signal having a third number of half-periods of a format to conform to a transition of the first phase distinguished carrier signal to the second phase distinguished carrier signal, and sequentially arranging the first number of half-periods of the first phase distinguished carrier signal, the third number of half-periods of the matching carrier signal and the second number of half-periods of the second phase distinguished carrier signal.

17 Claims, 8 Drawing Sheets

DIGITAL MODULATION AND SHIFT KEYING

CROSS-REFERENCE TO RELATED APPLICATIONS

The present application claims the benefits of U.S. provisional patent application No. 60/430,459 filed Dec. 3, 2002, which is hereby incorporated by reference.

TECHNICAL FIELD

The invention relates to digital communication, or more particularly to the modulation of a carrier with digital information.

BACKGROUND

Digital modulation of signals is a necessary component of communication of digital information across a network. Generally, the object of modulation is efficient transmission of information across a channel. Modulation operates by keying shifts in analog characteristics in response to the encoded modulation input. Modulation in its simplest form shifts frequency, amplitude or phase.

A sequence of modulated signals may give rise to sharp discontinuities of slope in the modulated carrier. Such discontinuities are associated with high harmonics. This is bandwidth intensive. Such use of bandwidth may be incompatible with efficient communication system design. Further, random occurrence of discontinuities within the communication may add bandwidth without introducing ancillary benefits such as reliable synchronization.

Accordingly, it is an object of the present application to obviate or mitigate some or all of the above disadvantages.

SUMMARY

According to the present invention, there is provided a method of modulating a carrier with digital information having a series of datums represented in a plurality of symbols, said method comprising:
  selecting a first number of half-periods of a first phase distinguished carrier signal for representing a corresponding symbol of a first one of said datums;
  selecting a second number of half-periods of a second phase distinguished carrier signal for representing a corresponding symbol of the datum following said first datum;
  determining at least one matching carrier signal having a third number of half-periods of a format to conform to a transition of said first phase distinguished carrier signal to said second phase distinguished carrier signal; and
  sequentially arranging said first number of half-periods of a first phase distinguished carrier signal, said third number of half-periods of said matching carrier signal and said second number of half-periods of said second phase distinguished carrier signal.

BRIEF DESCRIPTION OF THE FIGURES

Embodiments of the invention will be described by way of example only with reference to the accompanying drawings, in which.

DETAILED DESCRIPTION

Figure 1:
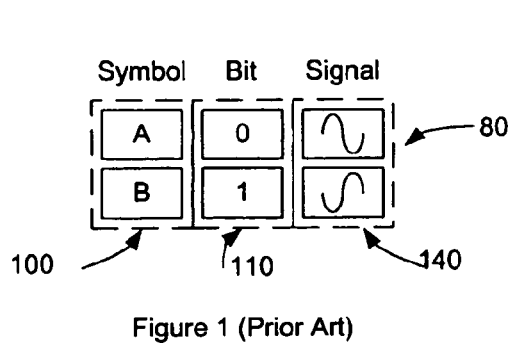
FIG. 1 is a table of datum representation in digital modulation.
Figure 2:
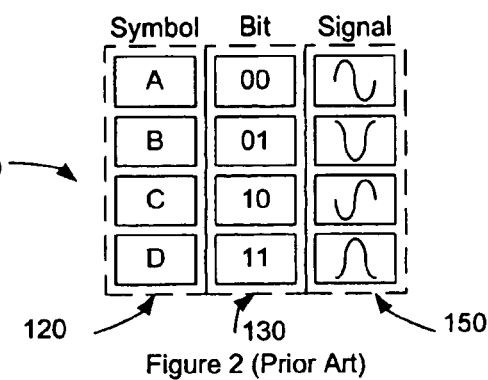
FIG. 2 is a table of datum representation in digital modulation.

Digital information is composed of a series of datum. Each datum is represented by one of n symbols. Typically such symbols are, themselves, a series of m binary digits. In this way a series of m binary digits may form up to $2^m$ symbols i.e. $n<=2^m$. Referring to FIGS. 1 and 2 (prior art) we have tables of two such representations 80 and 90. In the first representation 80, the possible datum of digital information 100 are binary (A,B) and represented by two possible symbols 110. In the second representation 90, the possible symbols of digital information 120 are quaternary and represented by four possible symbols 130 (A,B,C,D).

Figure 3:
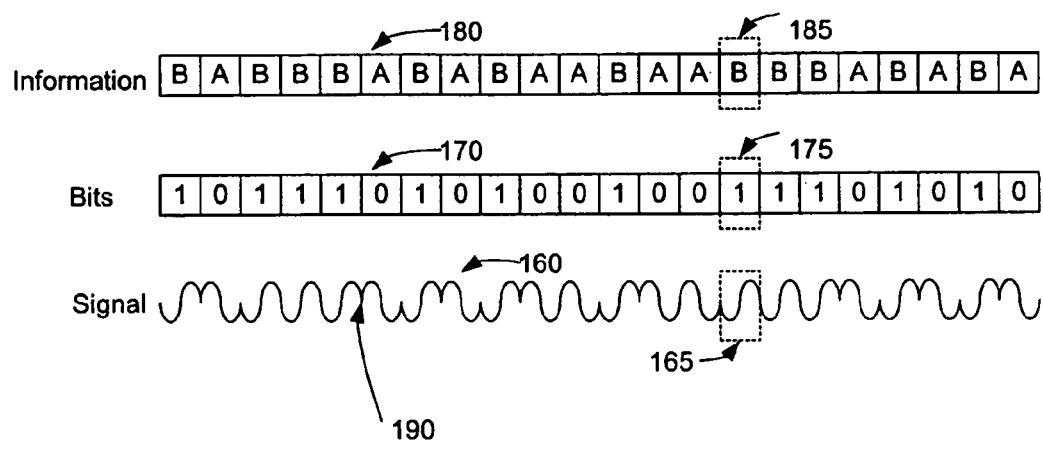
FIG. 3 an example of a Phase Shift Keying (PSK) modulated wave.

Modulation is a variation of a carrier wave in response to a modulating wave. Modulation may involve a variation of one or more aspects of the carrier. Phase Shift Keying (PSK) modulation is a digital modulation format. Referring again to the tables of FIGS. 1 and 2 we see the PSK carrier signals 140, 150, respectively, of the PSK modulated wave as associated with the corresponding symbols 110,130, respectively, they represent, and the corresponding possible datums of digital information 100,120, respectively. These different carrier wave signals 140 and 150, have identical frequency and amplitude, but different phase. In this way they are phase distinguished. The signals 140 of the first table are antipodal (180 degree phase shifted). The signals 150 of the second are 90 degree phase shifted. It is traditional that the carrier itself be sinusoidal. PSK has a constant envelope, giving it the desirable quality of imperviousness to non-linearity. Referring to FIG. 3 (prior art) we have an example of a PSK modulated wave 160 (composed of signals 165), the series 170 of digital symbols 175 the signals represent, and the digital information 180 used to modulate it (composed of the datums 185 that correspond to symbols 175). This example uses the representation 80 of FIG. 1. In PSK modulation, it is convenient, but not necessary, for each modulated datum of information to be signaled with one, or multiple, half period(s) of carrier wave i.e. an integral number of periods. To simplify the generation of the modulated signal when a Digital to Analog Converter (DAC) is used to convert a table of values, it is convenient to make use of waveforms that include integral number of periods. When the number of periods is a non-integral number, the transmission of the fraction of period of the carrier waveforms at the end of each symbol causes the phase of the signal to vary from one starting point of a symbol to the other. An integral number of period eases the waveform generation since it is sufficient to repeatedly transmit the same waveform to a sine wave with no phase discontinuities. If an integral number of half-periods is used, generation of a continuous wave is as simple as for the integral case as long as the polarity of the waveform is toggled from one transmission to the other when this number is odd. For an even number of half-periods, we have an integral number of periods.

For simplicity, we have illustrated one integral number of periods per datum. Those skilled in the art will understand the other possible PSK modulation schemes involving M-ary (binary, tertiary, etc.) data or use of differential shift keying (symbol determined by change of phase rather than phase.)

Figure 4:
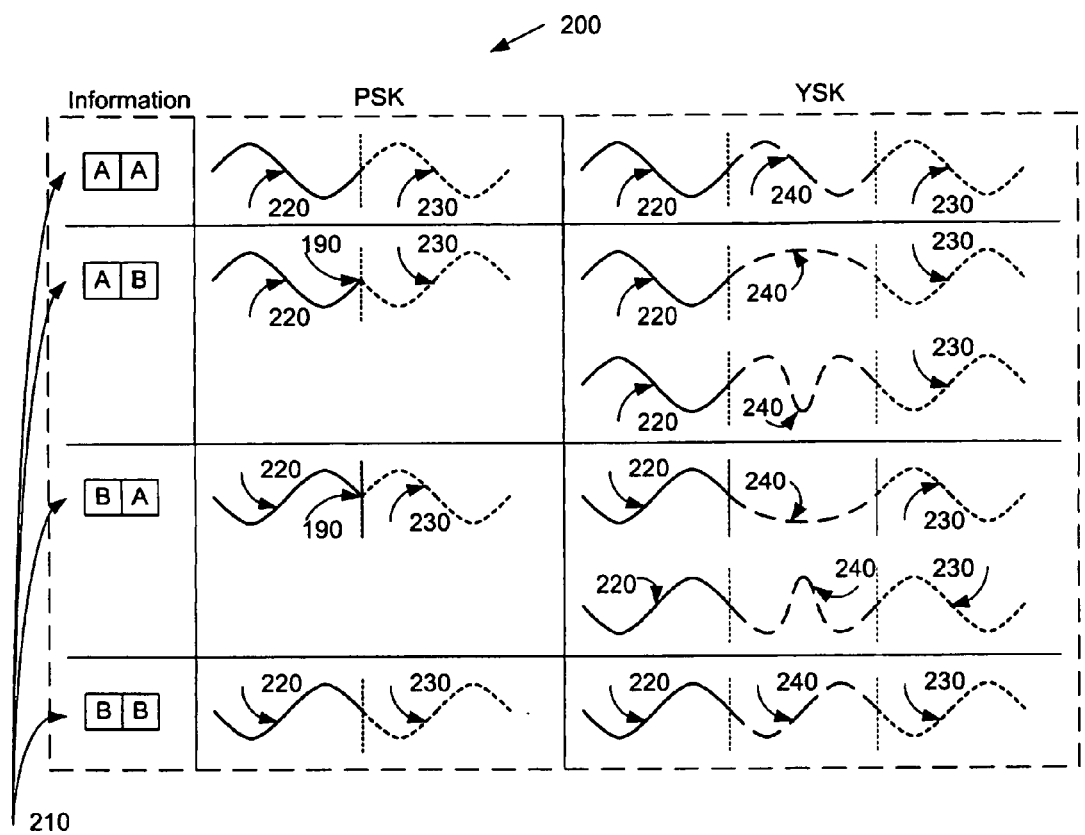
FIG. 4 is a table comparing a Yaw Shift Keying (YSK) enhanced version of PSK to un-enhanced PSK.

In a traditional PSK modulated signal, as per FIG. 3, sharp discontinuities of slope 190 may arise at the point of transition between successive signals. The resulting high harmonics are undesirable in communication systems. One aspect of the invention is a method of modulation in which two sets of symbols are employed. The first (data) symbol set is information oriented. The symbol sets are interleaved, and the second (matching) symbol set is chosen to avoid sharp discontinuities. Referring to FIG. 4 such a method, hereinafter referred to as Yaw-Shift Keying (YSK), is discussed as applied to PSK.

FIG. 4 is a table 200 comparing YSK enhanced version of PSK to PSK. Column one shows all the permutations of successive digital information 210 to be modulated for the modulation representation 80. Column two is the corresponding PSK Modulated carrier. The transitions from preceding carrier waves 220 to successive carrier waves 230 may give rise to discontinuities of slope 190. Column three shows possible corresponding YSK enhanced modulation. In this enhancement, similar to PSK:

each symbol of the digital information 210 is represented, in part, by a different carrier wave signal, 220, 230; these carrier wave signals 220, 230 have identical frequency and amplitude, but can have different phase. (phase distinguished);

and the carriers themselves are sinusoidal.

However, in the inventive method, between two successive carrier wave signals (data) a matching carrier signal (support) 240 is inserted. Such a wave signal:

conforms to (i.e. has no discontinuity or discontinuity of slope), at its beginning, the preceding carrier wave, 220, and at its end, the successive carrier wave, 230;

and has duration equal to an integral number of carrier ½ sinusoids (one is illustrated in the table 200).

Note that matching waves of both higher and lower general frequency (than the carrier) are shown. Either of these waves are compatible. This implementation (discontinuity reduction) reduces bandwidth. Other implementations could use waveforms that facilitate synchronization (e.g. Spikes or high frequency burst for carrier recovery as for the color burst in TV signals.)

In YSK enhancement, modulation is staggered between waveforms (like the carrier waves 220, 230) devoted to transporting information, and waveforms (like the matching carrier 240) devoted to easing recovery (bandwidth control, synchronization).

Both these examples use a single carrier wave period for the carrier waves 220, 230. However, for ease of generation, one can envision using any integral number of ½ periods for YSK enhanced PSK, as is the case in PSK. In cases where generating fractional period phase shifts is not an issue, the number of periods is, in fact, immaterial.

For a given representation (e.g. representation 80, 90) the set of transitions (for all permutations of preceding 220 and successive 230 carrier signals) will require matching signals 240 for each transition. Where the successive waves are identical, a third identical wave is a simple choice for the matching carrier signal 240. (provided bandwidth reduction is the goal. A totally different waveform might be preferred if ease of synchronization is the priority.) In the table 200 we have shown a shaped waveform for the matching carrier signal 240 where the successive waves 220, 230 are antipodal.

This is not to imply the shown matching waveforms 240 are the only choices. One possible basis of matching wave signals 240 is sinusoidally modulated quadrature carriers from which linear combinations may be derived to satisfy the various transitions. Such signals are used in minimum-shift keying (MSK). One advantage of using such particular sinusoids is they produce an overall signal that is phase continuous. To satisfy this criteria, the matching signals 240 do not give rise to a discontinuity or change in slope that substantially negatively influences the communication system. Another advantage of using MSK signals relies in the fact that it involves the minimum frequency spacing that leads to a signal which is phase continuous. Since this method represents the maximum reduction in bandwidth, this particular shaping of the matching signals is referred to as Reduced Yaw Shift Keying (RYSK). Note that MSK is applicable only if the matching signal differs by ½ period from the signaling waveform In other cases a broader spectrum results. As it can be seen from FIG. 4, the matching carrier signal 240 may be of higher or lower frequency than the carrier waves 220, 230. Thus the average frequency of the YSK signal may be equal to the frequency of the carrier waves 220, 230. Instantaneously, it may drift from this center frequency to higher or lower values in a manner that depends on the data symbol. Due to this frequency "yawing" that the present invention is termed "yaw shift keying" (YSK). In regard to the signal's bandwidth, it is an advantage to have matching signals 240 of higher and lower frequency than the center frequency (of waves 220, 230) since it leads to a average spectrum of the signal which is symmetrical when one support waveform is used as often as the other. Other implementations may make use of support waveforms that are both of higher, or lower, frequency than the frequency of the signaling waveform depending on the desired spectrum of the signal. More than two support waveforms can also be considered in order to spread the signal's energy across a wider bandwidth.

Figure 5:
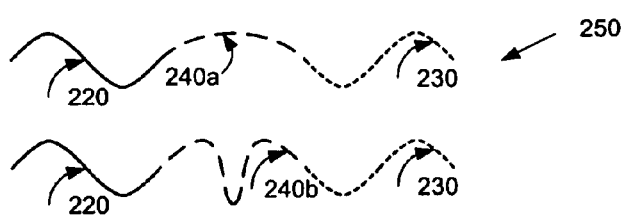
FIG. 5 is a comparison of two matching signals: one higher and one lower frequency.

In the example 250 of FIG. 5, waveforms are used for the matching signals 240a and 240b that respectively, are composed of substantially, lower and higher frequency components than the base carrier frequency of the preceding and successive carriers 220, 230, respectively. It is possible to allow for multiple satisfactory matching wave signals 240 (such as examples 240a and 240b) per individual transition, and to chose between them on a transition by transition basis. For a given transition, one matching signal 240 of the possible satisfactory matching wave signals may then be chosen. In this manner, the frequency side-bands of the carrier may be balanced by alternating between a higher and lower spectral matching signal 240. This balancing is desirable. Alternatively, another information signal (based on the matching choice) may be superimposed upon the modulated carrier by deliberately choosing amongst possible matching signals 240. In this sense, it is possible to interleave two sets of digital information in one phase continuous carrier. The first (communicated with signals including 220, 230) is phase encoded; the second (communicated with signals including 240) is frequency encoded.

It may be understood by one skilled in the art that the principles of YSK extend to other modulation formats. PSK is used here for illustration, but the idea could be applied to frequency or amplitude shift keying as well. The central principle is a modulated signal composed of interspersed matching signals between information, in such a manner as to maintain continuous phase.

Figure 6:
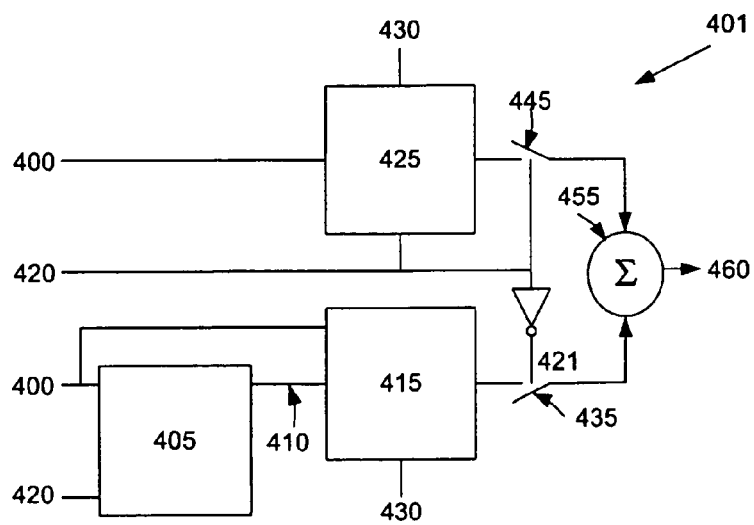
FIG. 6 is a diagram of a YSK modulation apparatus.

FIG. 6 is an apparatus 401 for generating the YSK modulation. The apparatus consists of a preceding symbol memory 405, a matching signal lookup 415, a carrier signal lookup 425, switches 435, and 445, and summation unit 455. The symbol memory 405 is input coupled to the input symbol port 400, and the carrier/matching clock port 420. The symbol memory 405 output is coupled to the preceding input of the matching signal lookup 415 via connection 410. Matching signal lookup 415 is also coupled to a synchronizing clock port 430 and to the input symbol port 400 at the successive input. The carrier signal lookup 425 is input coupled to the input symbol port 400, the synchronizing clock port 430, and the carrier/matching clock 420. Switches 445 and 435 are control coupled to the carrier/matching clock port 420 and its complementary port 421, respectively. Switch 435 couples the matching signal lookup 415 output to a summation unit 455 input. Switch 445 couples the carrier signal lookup 425 output to a summation unit 455 input. The output of the summation unit 455 is the YSK modulation apparatus output 460.

Figure 7:
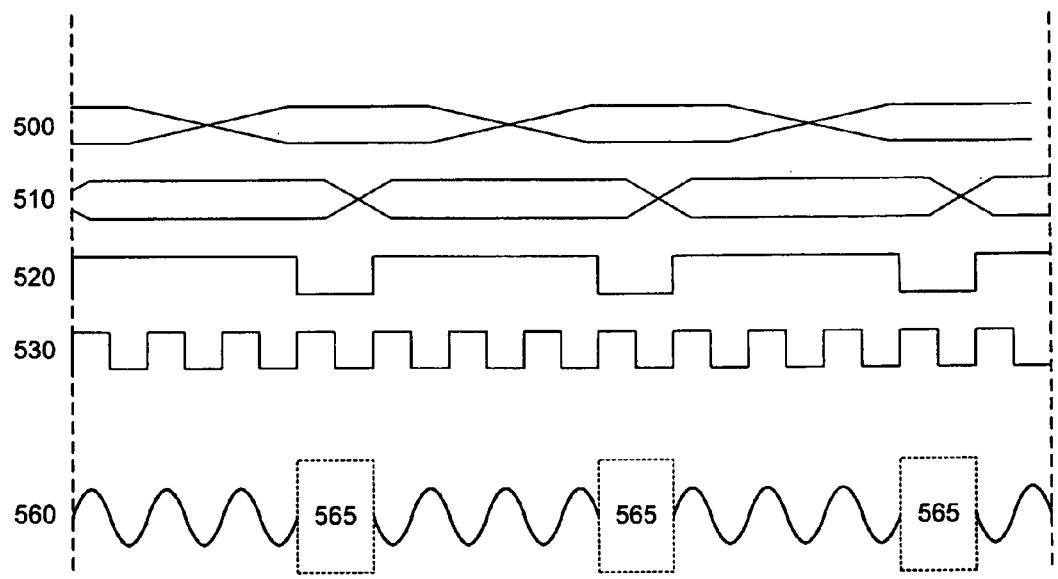
FIG. 7 is a timing diagram associated with the apparatus of FIG. 6.

FIG. 7 shows a signal operation example of apparatus 401. The input symbol 500 is asserted on the input symbol port 400, and must be valid as shown. The carrier/matching clock 520 is asserted on the carrier/matching clock port 420, and must be valid as shown. The symbol memory 405 records the current input symbol 500, on the rising edge of the carrier/matching clock 520 and asserts this information 510 on connection 410. Due to this, the matching signal lookup 415 has, at the falling edge of the carrier/matching clock 520, access to the current input symbol 500 at its successive input and the preceding input symbol 500 at its preceding input. The matching signal lookup 415 with these signals along with synchronizing clock 530, (via synchronizing clock port 430) generates matching signals 565 in accordance with the YSK method q.v. The carrier signal lookup 425 has access to input symbol 500, the carrier/matching clock 520, and the synchronizing clock 530. These allow it to generate carrier signals for the appropriate number of periods of carrier. This example shows 3 carrier periods and 1 matching period. The switches 445, 435 are governed by the carrier/matching clock 520 (via the carrier/matching clock port 420 and its complementary port 421). Along with the summation unit 455, the switches 445, 435, merge the output of the lookups 415, 425 to produce a single YSK wave 560 at the YSK modulation apparatus output 460.

Those skilled in the art will understand that YSK may be coherently detected with standard means i.e. where there is no question of synchronization between modulation and demodulation, the portion of the YSK wave containing the information may be directly demodulated. In the case non-coherent demodulation, however, YSK poses specific challenges.

Referring again to the examples of YSK modulated carrier signals 250 of FIG. 5, efforts to demodulate a carrier signal, 220,230, are complicated by the need to locate them amongst the matching signals 240a, 240b.

Figure 9:
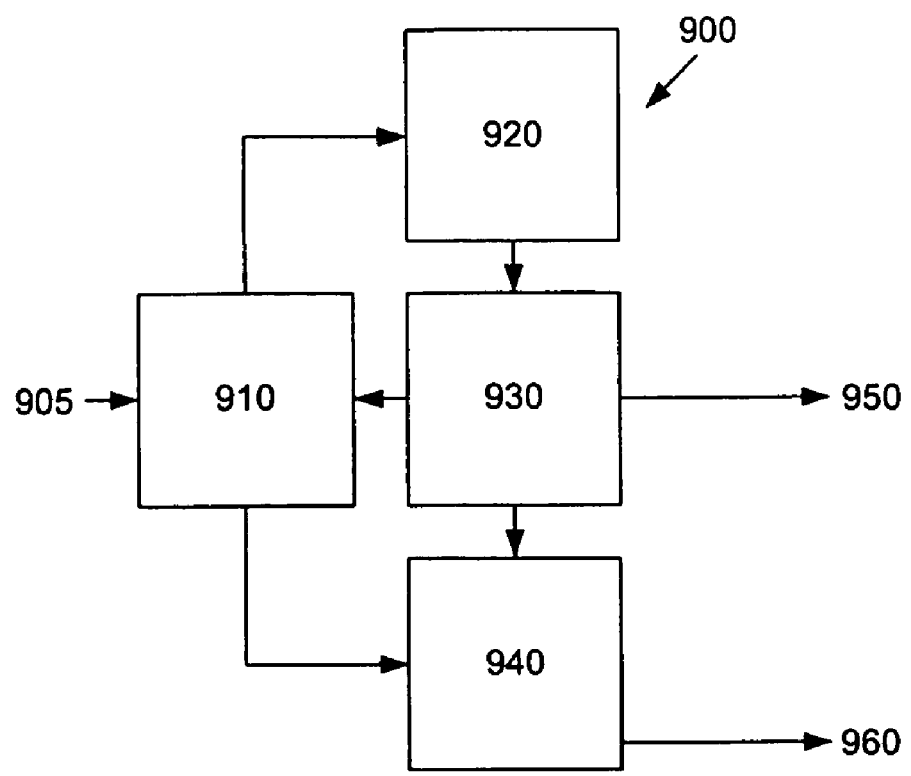
FIG. 9 is a diagram of a YSK demodulation apparatus.

FIG. 9 illustrates an apparatus 900 for demodulating YSK signals. A YSK signal input 905 is input coupled to a switch 910. The switch 910 is output coupled to a support demodulator 920 and a data demodulator 940. A synchronizer 930 is input coupled to the support demodulator 920 and output coupled to the control terminal of the switch 910. A Clock output 950 and data output 960 are coupled to the synchronizer 930 and data demodulator 940, respectively. There is a need to de-interleave the matching signal (support) 240 and carrier signal (data) 220,230 before attempting to recover the information. When the reception starts, a switch 910 is in the position that allows the signal to reach the support symbol demodulator 920. This demodulator triggers the synchronizer 930 each time it detects an incoming matching signal 240. The synchronizer 930 then activates the switch 910 at the appropriate time in order to make carrier signal(s) 220, 230 reach the data symbol demodulator 240 for the duration of one data signal 220, 230. At the same time, the synchronizer 930 generates a clock signal (on clock output 950) that indicates when an information symbol is available at the data output 960.

Figure 10:
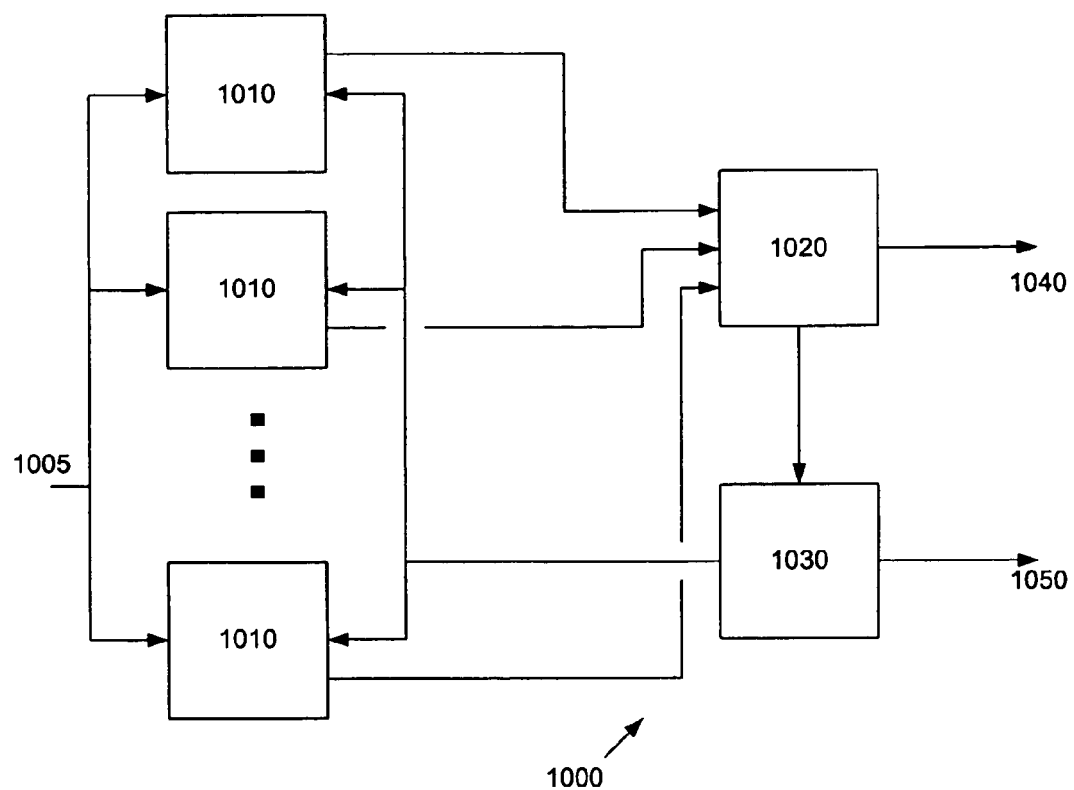
FIG. 10 is a diagram of another embodiment of a YSK demodulation apparatus.

The architecture shown in FIG. 9 is not the only one that may be used to demodulate YSK signals. Referring to FIG. 10, there is shown an alternate embodiment of a demodulation apparatus 1000, consisting of matched filters 1010, output coupled to a decision making circuit 1020, and input coupled to a synchronizer 1030 (which is in turn input coupled to the decision making circuit 1020). Data output 1040 is coupled to the decision making circuit 1020, clock output 1050 is coupled to the synchronizer 1030. This simplification of the demodulator's architecture is possible if the waveforms that represent the datum are selected having this in mind i.e. by selecting waveforms that are orthogonal.

In this apparatus, some filters 1010 are built to "recognize" the support signals 240 and other filters 1010 detect the data signals 220, 230. The decision making circuit 1020 is required to be able to identify which matched filter produces the largest output. The synchronizer 1030 is then fed with this information. The synchronizer 1030 analyses at what rate and for how long those matched-filters 1010 that are associated to the support signals 240 produce the largest output and then generates a signal that synchronizes the operation of every matched-filter 1010 with the timing of the incoming signals 220, 230, 240. This improves the filter reliability and, in turn, helps the decision making circuit 1020 in identifying the origin of largest outputs. Working on more reliable information, the synchronizer 1030 can iteratively improve its timing signal. At the same time, the decision-making circuit 1020 sends to its data output 1040 the demodulated data signal. Aware of the time at which these symbols become available, the synchronizer 1030 also generates a clock signal on the clock output 1050.

Figure 11:
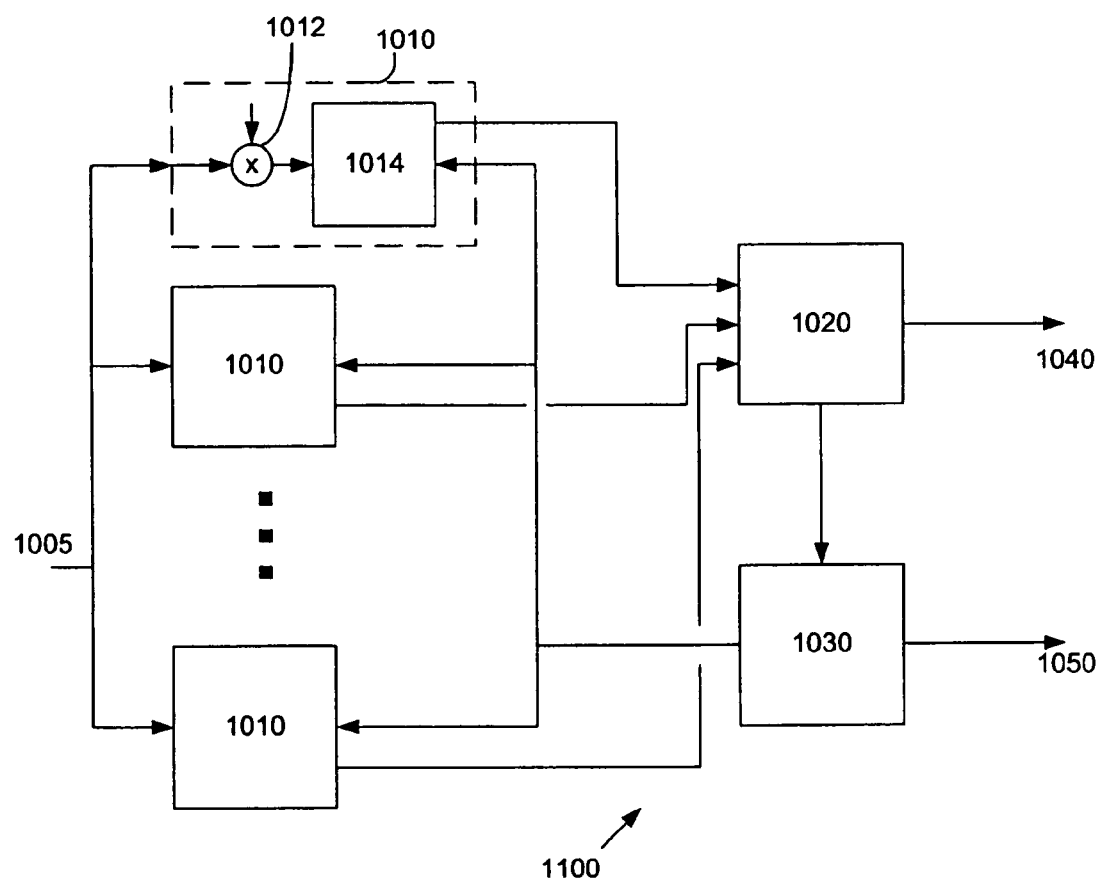
FIG. 11 is a diagram of a YSK demodulation apparatus illustrating one frequency filtering method.

When the signaling waveforms that are used to implement YSK modulation are sine waves such as those used for binary phase shift-keying (BPSK), PSK or frequency shift-keying (FSK), the matched filters 1010 that are shown in FIG. 10 may be built with a mixer 1012 and an integrate & dump circuit 1014 as shown in FIG. 11. For such a circuit, the waveform that feeds a given mixer 1012 determines which signaling waveforms the associated filter detects. The integrate & dump circuit 1014 then acts as a low pass filter. Provided that integration begins when a signal starts to come in and ends with the same signal, the integrate & dump circuit 1014 will produce a maximum output for a similar waveform. The output of the integrate & dump circuits 1014 corresponds to the cross-correlation value of the incoming signal with the waveform that drives the mixer. FIG. 11 thus shows a classical cross-correlation-type demodulator adapted for YSK signals. For such a demodulator 1100, the synchronizer 1030 controls at what time the integrate & dump circuit 1014 integrates in order for correct demodulation of YSK to take place.

In FIGS. 10 and 11, the number of matched filters depends on the particular waveforms that are used to implement YSK. This number may be reduced if some of these waveforms share properties. For example, BPSK involves two waveforms that only differ because of their respective polarity. Thus, the outputs of the two matched filters that may be used to demodulate a BPSK only differ because of their polarities. Hence, to eliminate one of these matched filters, a decision-making circuit that processes the magnitude and sign of its input may be used.

It may be understood by one skilled in the art that using YSK involves certain trade-offs with respect to the length of the carrier waves 220, 230 and the matching carrier 240. Consider non-coherent demodulation of such a signal using a cross-correlation system (for implementation purposes, a desirable method): The sampling of the succeeding unrelated signals, may cause the response of the cross-correlator to be, for a limited period of time, a blend of both a response that depends on a preceding wave 220 and a matching wave 240, or a matching wave 240 and a successive wave 230. Depending on the length of the sampling period, it may be impossible, to guarantee a pure sample of the matching wave. In order to avoid circuit complexity in response to symbol interference, it is highly desirable to achieve a pure sample. This implies a shorter sampling period relative to the successive waves 220, 230. Reducing the length of the correlation sample itself is limited by the correlator ability to successfully identify the necessary signals: improvement here is governed by the state of cross-correlator art. Reducing the length of matching wave 240 may have a positive effect on demodulation, but having matching waves that are relatively too short can cause the bandwidth of the signal to be unnecessarily large. Furthermore, increasing the length of the data bearing preceding and successive signals 220, 230, will have a deleterious effect on the data transfer rate. It can be understood from this that a compromise reflecting circuit complexity, data transfer rate, bandwidth, and data integrity is in order.

One aspect of the invention brings a solution to the problem of selecting the proper ratio for non-coherent demodulation. Consider a cross-correlator with a minimum effective sampling period of 1, and length L. We shall make N refer to the length of support bits (e.g: if that cross-correlator processes a given support—or interspersed—signal). If that cross-correlator processes a given signal of length N it produces L+N−1 values that depend on that signal. Therefore, the sampled correlation values must be spaced apart in time by at least L+N sampling intervals if situations for which both samples are affected by interspersed signals are to be avoided. On the other hand, the sampled correlation values must not be too far apart since this could lead to sampling of a correlation value that depends on two successive interspersed signals. By analyzing scenarios that involve various lengths of correlator and signals, it may be shown that the number of consecutive correlation values that only depend on a given data signal of M samples is M−L+1. This second condition means that the sampled correlation values must be spaced apart by at most M−L sampling intervals. Hence, we may write that the sampled correlation values must be spaced apart by a number of sampling interval T such that M−L>=T>=N+L.

This spacing must be larger than one to have more than one sampled correlation value per data bit. Therefore, the conditions that apply to the sampling of the correlation values also imply that the correlator's length must be smaller than the length of the data signal. Thus, the correlator of this embodiment only processes a part of each data signal at a time. To highlight this fact, we refer to it by saying that the embodiment makes use of partial-cross-correlators that computes partial cross-correlation values.

To preserve bandwidth, it is required to minimize the length of the data. Because we have a condition that states that the length of the data bits can be lowered down to the point for which we have M−L=T, we can conclude that the minimum length of the data bit can be such that M=T+L. Hence, for a given correlator length, the length of the data bits will be minimized if the sampling interval is kept to a minimum. Based on the conditions that are mentioned above, this is to say that we must have T=N+L. This last result allow us to find that we need to have T=(M+N)/2 to preserve bandwidth. This condition indicates that it is only necessary to evenly sample the correlation values at a rate that corresponds to two samples per duration of a data signal, 220 and 230, followed by a matching signal 240 to have pairs of sampled correlation values that each includes at least one value that only depends on a single data bit. If this condition is met, it is then only necessary to make use of classical time diversity combining or selection techniques to retrieve the information from the incoming bits. Combining techniques such as those that would involve comparison of the correlation values that form the pairs of value can then be considered as well as selection algorithm that would be based on identification of preamble sequences or detection of correct checksum values in the demodulated messages.

If the sampling rate of the correlation value is such that it is not required to demodulate the support signal, it becomes an advantage to reduce the length of the support signal to a minimum since this improves the overall throughput of the communication system. However, in order to have a YSK signal that can also be demodulated by circuits which take the support signal into account, it is better to keep the length of the support signal long enough to allow reliable demodulation of the support signal. The selection of a length for a bit can then be driven by a need to further simplify the design of the demodulators. Because it can be advantageous to have correlators that are all of the same length, one can think about using support signals that are of the same length as the correlators that are to be used to demodulate the data bits. In that case, the number of correlation values that depend on the support bits will be one per support bit. This will be desirable for those demodulators that do not demodulate the support signals and it will be acceptable for the other types of YSK demodulator that make use of the timing information carried by the support signals. Under these circumstances, the conditions given previously imply that N=L=(M+N)/4 which indicates that these types of demodulator will be able to demodulate a YSK signal for which the data signals are 3 times longer than the support signals. Different ratios can also be considered. What is important here is to select a ratio that allows the partial-cross-correlator to produce two or more partial-cross-correlation values per data signal in a way that ensures that at least one value per set depends only on the data signals.

Figure 8:
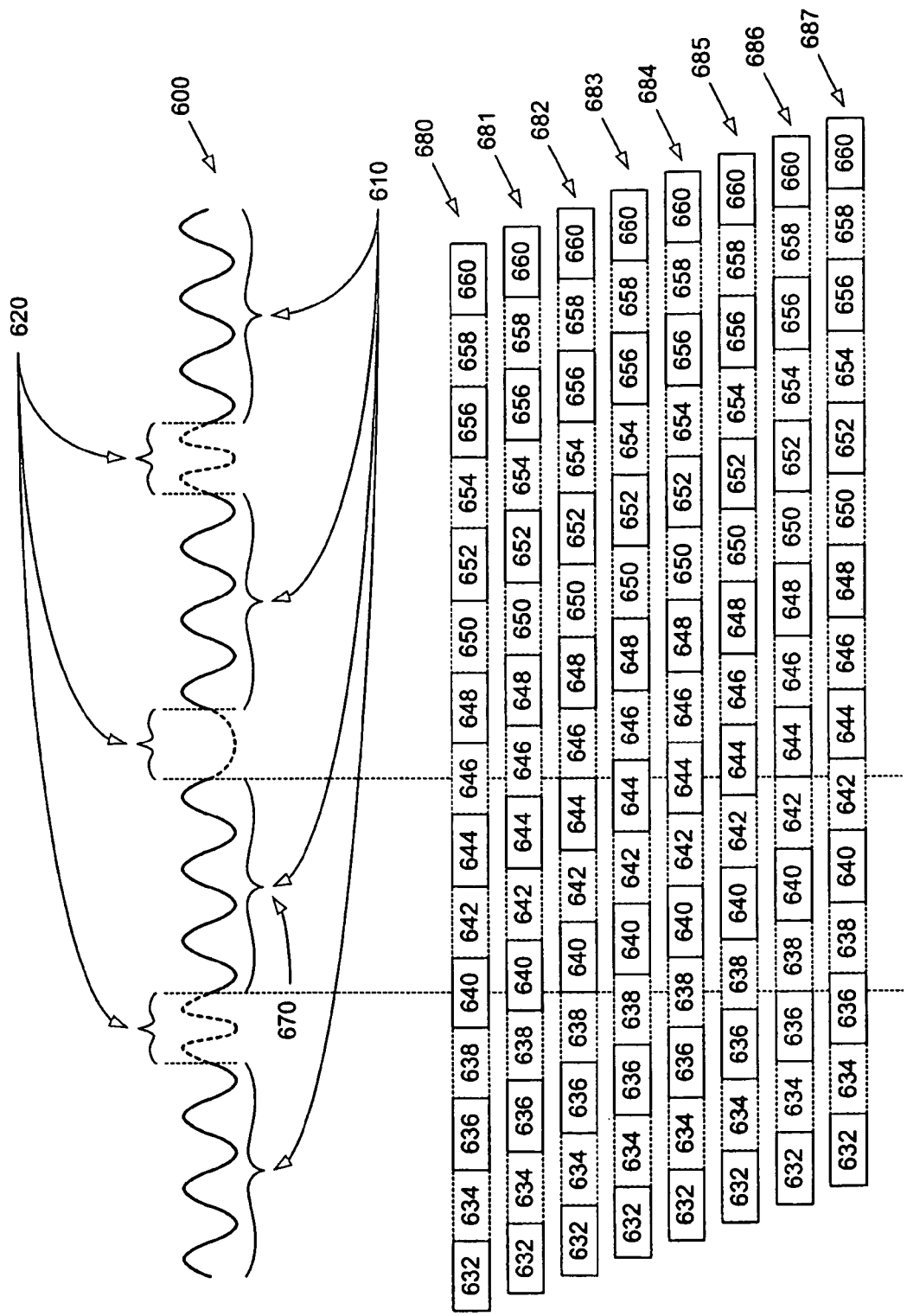
FIG. 8 is a timing diagram illustrating the implications of non-coherent detection.
Figure 12:
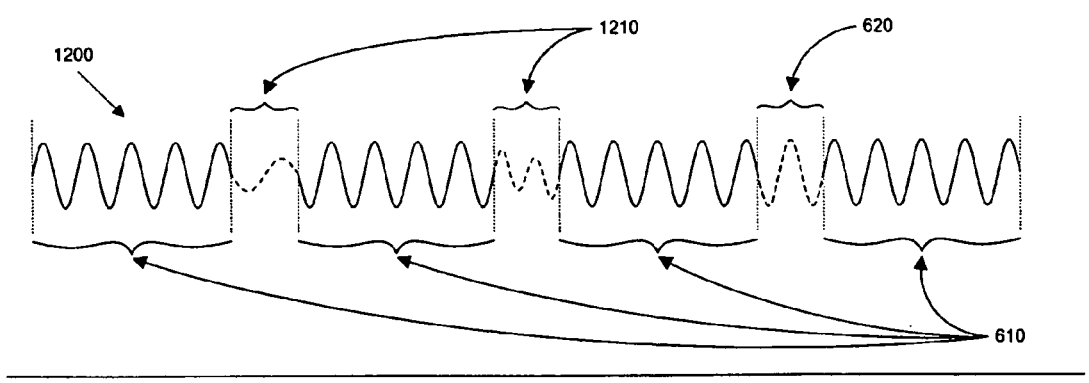
FIG. 12 is a schematic diagram of a shaped RYSK signal.

A demodulation example in correspondence with these principles is shown in FIG. 8. Referring to this is a YSK modulated carrier 600. Matching signals 620 are interspersed between long carrier signals 610. The matching signals 620 are shown to be of constant amplitude for simplicity. Shaped waveforms described above could also have been used instead of the constant amplitude matching signals 620. Referring to FIG. 12 that shows a shaped RYSK signal 1200, shaped support waveforms 1210 are used when phase shifts are required and constant amplitude support waveforms 620 are selected otherwise. The shaped support waveforms 1210 have an amplitude that first decreases and later increases in a way that provides a narrower signal bandwidth; the amplitude variation being a result of the multiplication of the support sine waves with one period of a cosine signal which last the same as the support signal 1210. Digital narrow band filtering techniques can also be involved in the design of the matching signal 1210 to provide additional bandwidth reduction. In the demodulation technique of the invention, the long carrier signals 610 are at least 3 times the duration of the matching signals. Demodulation sampling is not constant in this technique. Also in FIG. 8 sampling patterns are shown 680-687 in various states of alignment with the received carrier 600. The sampling pattern consist of equal duration alternating periods of sampling 632, 636, 640, 644, 648, 652, 656, 660, and waiting/not sampling 634, 638, 642, 646, 650, 654, 658 interspersed.

In any given sampling period 632, 636, 640, 644, 648, 652, 656, 660, the received carrier 600 is detected using demodulation techniques common in the art (e.g. correlation). A carrier signal 610 will be successfully demodulated to a valid symbol by at least one of the sampling periods 632, 636, 640, 644, 648, 652, 656, 660. Using the example of received carrier 670, demodulation occurs in either sampling period 640 and/or 644 in any alignment 680-687.

The demodulation results of pairs of sampling periods e.g. (640 and 644) both or either of which may be valid. In normal operating conditions, the symbol may be determined by the valid sample. Excessive noise may result in no valid signal or contradictory valid signals. In this case the system must acknowledge demodulation error. Where valid symbols are successively demodulated, there could be an uncertainty if these valid symbols corresponded to the same, or successive, signals. Therefore demodulated symbols are, ideally, considered in relation to the second previous demodulated symbol e.g. sample 648 may be considered relative to 640 for differential signaling. This, in effect, results in two interleaved channels. One of these channels, if clock drift may be ignored, is likely preferable. Lastly, in order to determine which channel is preferable, the carrier 600 may include a preamble of several datums. Comparison of the decoded and expected preamble identifies the preferable channel.

A method of demodulation compatible with the aforementioned example is as follows: The incoming signals are sampled in predetermined periods. The samples are partially cross-correlated to detect data signals. A history of the correlations is used to generate data, and synchronization. Synchronization is used to control future sampling.

Although the present invention has been described by way of particular embodiments and examples thereof, it should be noted that it will be apparent to persons skilled in the art that modifications may be applied to the present particular embodiment without departing from the scope of the present invention.

What is claimed is:

1. A method of transmitting digital information having a series of datums represented in a plurality of symbols from a modulator to a demodulator, said method comprising:

a) selecting a first number of half-periods of a first phase distinguished carrier signal for representing a corresponding symbol of a first datum of said series of datums;

b) selecting a second number of half-periods of a second phase distinguished carrier signal for representing a corresponding symbol of a datum following said first datum;

c) determining at least one matching carrier signal having a third number of half-periods of a format to conform to a transition of said first phase distinguished carrier signal to said second phase distinguished carrier signal;

d) sequentially arranging into a modulated carrier said first number of half-periods of a first phase distinguished carrier signal, said third number of half-periods of said at least one matching carrier signal and said second number of half-periods of said second phase distinguished carrier signal; and e) transmitting said modulated carrier from said modulator to said demodulator.

2. The method as defined in claim 1, wherein said first number of half-periods is equal to said second number of half-periods.

3. The method as defined in claim 2, wherein a ratio of said first number of half-periods to said third number of half-periods is compatible with a partial-cross-correlator demodulator module in said demodulator that produces a plurality of partial-cross-correlation values for each said phase distinguished carrier signals, and said plurality of partial-cross-correlation values being solely dependent on said phase distinguished carrier signals.

4. The method as defined in claim 3, wherein the ratio of said first number of half-periods to said third number of half-periods is 3.

5. The method as defined in claim 1, wherein said first number of half-periods is equal to said third number of half-periods.

6. The method as defined in claim 2, wherein said third number of half-periods is 1.

7. The method as defined in claim 1, wherein said at least one matching carrier signal is selected from a set including two carrier signals having antipodal phases.

8. The method as defined in claim 1, wherein said at least one matching carrier signal is selected from a set including linear combinations of sinusoidally modulated quadrature carrier signals.

9. The method as defined in claim 1, wherein at least one matching carrier signal is determined in response to additional digital information.

10. The method of transmitting digital information as claimed in claim 1, wherein said modulated carrier is generated by yaw shift keying (YSK) modulation.

11. A method of extracting digital information having a series of datums represented in a plurality of symbols contained in a modulated carrier containing therein a first number of half-periods of a first phase distinguished carrier signal representing a corresponding symbol of a first datum of said series of datums, a second number of half-periods of a second phase distinguished carrier signal for representing a corresponding symbol of a datum following said first datum and a third number determined from at least one matching carrier signal having of half-periods of a format to conform to a transition of said first phase distinguished carrier signal to said second phase distinguished carrier signal, said method comprising:

a) sampling said modulated carrier into sampled results;

b) detecting matching signals from the sampled results;

c) synchronizing a clock with said matching signals;

d) detecting long carrier signals associated with same modulated carrier from the sampled results in a correct interval as determined by said clock; and e) demodulating said long carrier signals from the modulated carrier.

12. The method of extracting digital information as claimed in claim 11, further comprising:

a.1) partially cross-correlating said sampling results; and a.2) synchronizing said sampled results utilizing a history of said cross-correlation results.

13. The method of extracting digital information as claimed in claim 12, wherein said modulated carrier is generated by yaw shift keying (YSK) modulation.

14. A method of transmitting digital information having a series of datums represented in a plurality of symbols between a pair of corresponding modulator and demodulator, said method comprising:

a) at said modulator:

i) selecting a first number of half-periods of a first phase distinguished carrier signal for representing a corresponding symbol of a first datum of said series of datums;

ii) selecting a second number of half-periods of a second phase distinguished carrier signal for representing a corresponding symbol of a datum following said first datum;

iii) determining at least one matching carrier signal having a third number of half-periods of a format to conform to a transition of said first phase distinguished carrier signal to said second phase distinguished carrier signal; and iv) sequentially arranging into a modulated carrier said first number of half-periods of a first phase distinguished carrier signal, said third number of half-periods of said at least one matching carrier signal and said second number of half-periods of said second phase distinguished carrier signal;

b) transmitting said modulated carrier from said modulator to said demodulator; and c) at said demodulator:

i) sampling said modulated carrier;

ii) detecting matching signals from the modulated carrier;

iii) synchronizing a clock with said matching signals;

iv) detecting long carrier signals from the modulated carrier in the correct interval as determined by said clock; and v) demodulating said long carrier signals from the modulated carrier.

15. The method of transmitting digital information as claimed in claim 14, wherein said modulated carrier is generated by yaw shift keying (YSK) modulation.

16. A method of transmitting digital information having a series of datums represented in a plurality of symbols between a modulator and demodulator, said method comprising:

a) at said modulator:

i) selecting a first number of half-periods of a first phase distinguished carrier signal for representing a corresponding symbol of a first datum of said series of datums;

ii) selecting said first number of half-periods of a second phase distinguished carrier signal for representing a corresponding symbol of a datum following said first datum;

iii) determining at least one matching carrier signal having a second number of half-periods of a format to conform to a transition of said first phase distinguished carrier signal to said second phase distinguished carrier signal, wherein the ratio of said first number of half-periods to said second number of half-periods is compatible with a partial-cross-correlator demodulator that produces a plurality of partial-cross-correlation values for each said phase distinguished carrier signals, and said plurality of partial-cross-correlation values being solely dependent on said phase distinguished carrier signals; and iv) sequentially arranging into a modulated carrier said first number of half-periods of a first phase distinguished carrier signal, said third number of half-periods of said matching carrier signal and said second number of half-periods of said second phase distinguished carrier signal;

b) transmitting said modulated carrier from said modulator to said demodulator; and c) at said demodulator:

i) sampling the modulated carrier;

ii) partially cross-correlating said sampling results; and iii) synchronizing said sampling on the basis of a history of said cross-correlation results.

17. The method of transmitting digital information as claimed in claim 16, wherein said modulated carrier is generated by yaw shift keying (YSK) modulation.

* * * * *